(12) United States Patent
Mori et al.

(10) Patent No.: US 8,958,208 B2
(45) Date of Patent: Feb. 17, 2015

(54) SEMICONDUCTOR DEVICE

(75) Inventors: Shogo Mori, Kariya (JP); Shinobu Tamura, Oyama (JP); Shinobu Yamauchi, Oyama (JP); Taizo Kuribayashi, Oyama (JP)

(73) Assignees: Kabushiki Kaisha Toyota Jidoshokki, Aichi-ken (JP); Showa Denko K.K., Tokyo (JP)

( * ) Notice: Subject to any disclaimer, the term of this patent is extended or adjusted under 35 U.S.C. 154(b) by 386 days.

(21) Appl. No.: 13/428,542

(22) Filed: Mar. 23, 2012

(65) Prior Publication Data

US 2012/0175765 A1 Jul. 12, 2012

Related U.S. Application Data

(62) Division of application No. 12/496,391, filed on Jul. 1, 2009, now Pat. No. 8,472,193.

(30) Foreign Application Priority Data

| Jul. 4, 2008 | (JP) | ................................. 2008-176087 |
| Jul. 7, 2008 | (JP) | ................................. 2008-176955 |
| Jul. 11, 2008 | (JP) | ................................. 2008-181314 |

(51) Int. Cl.
*H05K 7/20* (2006.01)
*H01L 23/367* (2006.01)
(Continued)

(52) U.S. Cl.
CPC .......... *H01L 23/367* (2013.01); *H05K 7/20518* (2013.01); *H05K 7/2039* (2013.01); *H05K 7/20263* (2013.01); *H01L 23/3735* (2013.01); *H01L 23/473* (2013.01)

USPC ........... 361/710; 361/619; 361/698; 361/699; 361/702; 361/709; 361/711; 361/719

(58) Field of Classification Search
CPC . H01L 23/3735; H01L 23/367; H01L 23/473; H05K 7/20263; H05K 7/2039
USPC .......... 361/619, 698, 699, 702, 709–711, 719
See application file for complete search history.

(56) References Cited

U.S. PATENT DOCUMENTS

| 4,567,505 | A | * | 1/1986 | Pease et al. .................... 257/713 |
| 5,005,640 | A |   | 4/1991 | Lapinski et al. |

(Continued)

FOREIGN PATENT DOCUMENTS

| DE | 10337640 A1 | 3/2005 |
| DE | 10 2007 046 349 A1 | 4/2008 |

(Continued)

OTHER PUBLICATIONS

JP2004-22914, Jan. 22, 2004, English Translation.*

(Continued)

*Primary Examiner* — Anatoly Vortman

(57) ABSTRACT

A semiconductor device is disclosed that includes an insulation substrate, a metal wiring layer, a semiconductor element, a heat sink, and a stress relaxation member located between the insulation substrate and the heat sink. The heat sink has a plurality of partitioning walls that extend in one direction and are arranged at intervals. The stress relaxation member includes a stress absorbing portion formed by through holes extending through the entire thickness of the stress relaxation member. Each hole is formed such that its dimension along the longitudinal direction of the partitioning walls is greater than its dimension along the arranging direction of the partitioning walls.

4 Claims, 6 Drawing Sheets

(51) Int. Cl.
    *H01L 23/373* (2006.01)
    *H01L 23/473* (2006.01)

(56) References Cited

U.S. PATENT DOCUMENTS

| | | | |
|---|---|---|---|
| 5,099,311 A | 3/1992 | Bonde et al. | |
| 5,109,317 A * | 4/1992 | Miyamoto et al. | 361/715 |
| 5,126,829 A * | 6/1992 | Daikoku et al. | 257/713 |
| 5,142,441 A | 8/1992 | Seibold et al. | |
| 5,170,319 A | 12/1992 | Chu et al. | |
| 5,455,457 A * | 10/1995 | Kurokawa | 257/712 |
| 5,587,882 A * | 12/1996 | Patel | 361/705 |
| 5,805,430 A | 9/1998 | Atwood et al. | |
| 5,901,037 A | 5/1999 | Hamilton et al. | |
| 6,014,312 A | 1/2000 | Schulz-Harder et al. | |
| 6,101,715 A | 8/2000 | Fuesser et al. | |
| 6,261,404 B1 | 7/2001 | Baska et al. | |
| 6,903,929 B2 | 6/2005 | Prasher et al. | |
| 6,986,382 B2 | 1/2006 | Upadhya et al. | |
| 7,019,977 B2 * | 3/2006 | Lee et al. | 361/704 |
| 7,569,929 B2 | 8/2009 | Mori et al. | |
| 7,813,135 B2 | 10/2010 | Mori et al. | |
| 7,898,807 B2 | 3/2011 | Beaupre et al. | |
| 7,923,833 B2 | 4/2011 | Furukawa et al. | |
| 7,944,698 B2 * | 5/2011 | Colbert et al. | 361/709 |
| 2005/0248921 A1 | 11/2005 | Schmidt et al. | |
| 2006/0108098 A1 | 5/2006 | Stevanovic et al. | |
| 2006/0289152 A1 | 12/2006 | Leuschner et al. | |
| 2008/0079021 A1 | 4/2008 | Bayerer et al. | |
| 2008/0128896 A1 | 6/2008 | Toh et al. | |
| 2008/0179972 A1 | 7/2008 | Aoki et al. | |
| 2008/0290498 A1 | 11/2008 | Mori et al. | |
| 2008/0290499 A1 | 11/2008 | Nishi et al. | |
| 2009/0139704 A1 | 6/2009 | Otoshi et al. | |
| 2009/0141451 A1 | 6/2009 | Mori et al. | |
| 2009/0147479 A1 | 6/2009 | Mori et al. | |
| 2009/0200065 A1 | 8/2009 | Otoshi et al. | |
| 2009/0250195 A1 | 10/2009 | Yoshida et al. | |
| 2009/0314474 A1 | 12/2009 | Kimbara et al. | |
| 2010/0002397 A1 | 1/2010 | Toh et al. | |
| 2010/0051235 A1 | 3/2010 | Mori et al. | |
| 2010/0193941 A1 | 8/2010 | Mori et al. | |
| 2011/0005810 A1 | 1/2011 | Uneno et al. | |
| 2011/0094722 A1 | 4/2011 | Mori et al. | |
| 2011/0235279 A1 | 9/2011 | Mori et al. | |

FOREIGN PATENT DOCUMENTS

| | | |
|---|---|---|
| EP | 1 739 378 A1 | 1/2007 |
| EP | 1873827 A1 | 1/2008 |
| EP | 1901350 A1 | 3/2008 |
| JP | 02-068956 | 3/1990 |
| JP | 03-011798 | 1/1991 |
| JP | 05-299549 A | 11/1993 |
| JP | 2001-168256 A | 6/2001 |
| JP | 2001-284513 A | 10/2001 |
| JP | 2002-005591 A | 1/2002 |
| JP | 2002-368170 A | 12/2002 |
| JP | 2003-017627 A | 1/2003 |
| JP | 2003-101277 A | 4/2003 |
| JP | 2004-006717 A | 1/2004 |
| JP | 2004-022914 A | 1/2004 |
| JP | 2007-173405 A | 7/2007 |
| JP | 2007-201181 | 8/2007 |
| JP | 2008-135757 A | 6/2008 |
| WO | WO2005088222 A1 | 9/2005 |
| WO | WO 2007/072700 A1 | 6/2007 |
| WO | WO 2007/145352 | 12/2007 |
| WO | WO2008075409 A1 | 6/2008 |

OTHER PUBLICATIONS

Search Report dated Sep. 10, 2013, corresponding to related European Patent Application No. 11161897.1.
Search Report dated Sep. 10, 2013, corresponding to related European Patent Application No. 11161895.5.
First Office Action dated (Feb. 5, 2013) from corresponding Chinese Patent Application [with English translation thereof].
Office Action in Counterpart Japanese Application 2008-181314 (dated Oct. 2, 2012).
Partial search report for Application No. 09164413.8-1235, dated Jul. 21, 2010.
Search Report for Application No. 09164413.8-1235, dated Nov. 4, 2010.
Office Action for corresponding Korean Application No. 057675524, dated Dec. 16, 2010.
Non-Final Office Action, dated Jun. 16, 2014 from corresponding U.S. Appl. No. 13/428,584.

* cited by examiner

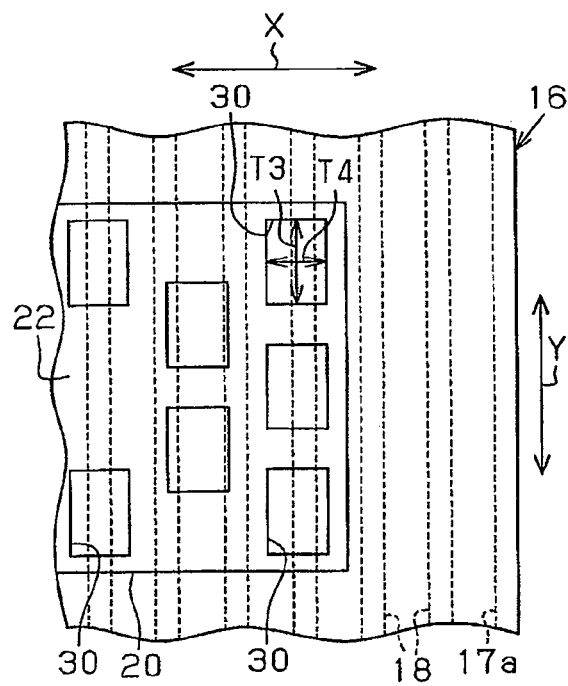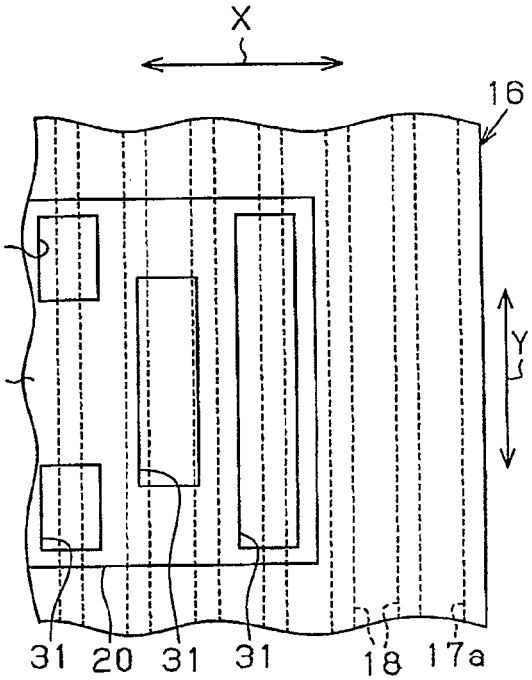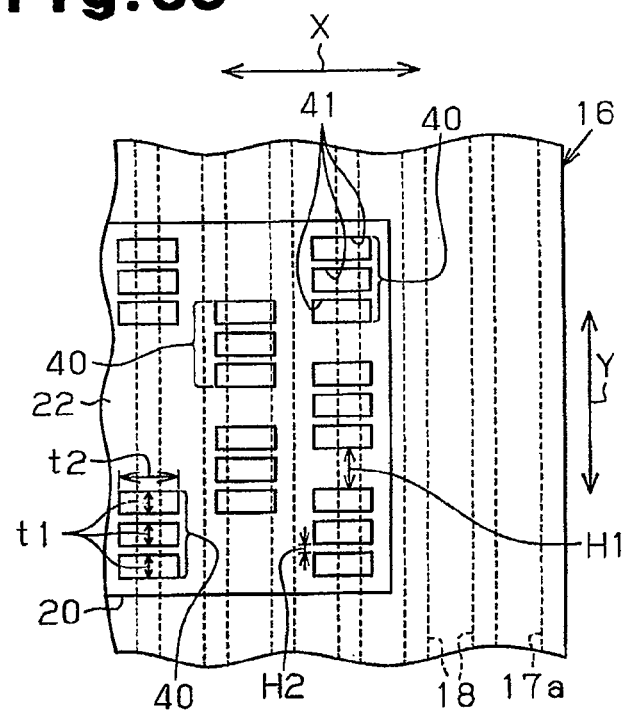

SEMICONDUCTOR DEVICE

This application is a divisional of U.S. application Ser. No. 12/496,391 filed on Jul. 1, 2009 and entitled "Semiconductor Device", which is incorporated herein by reference.

FIELD OF THE INVENTION

The present invention relates to a semiconductor device in which an insulation substrate and a heat sink are coupled to each other such that heat can be conducted therebetween.

BACKGROUND

Semiconductor devices have been known that have an insulation substrate made of, for example, aluminum nitride, front and back metal plates made of pure aluminum, a semiconductor element joined to the front metal plate by, for example, soldering, a heat sink serving as a heat radiating device joined to the back metal plate. The metal plates are joined to each of the front and back surfaces of the insulation substrate. The heat sink is coupled to the back metal plate to be thermally conductive with the back metal plate. The heat sink radiates heat generated by the semiconductor element. The above described semiconductor devices are required to maintain heat radiating performance of the heat sink for an extended period of time. However, depending on the use conditions, thermal stress is generated by the difference in coefficient of linear expansion between the insulation substrate, the metal plates, and the heat sink of the conventional configuration. This can cause joint portions to crack and warp, lowering the heat radiating performance of the heat sink.

To eliminate such a drawback, Japanese Laid-Open Patent Publication No. 2003-17627 discloses a semiconductor module having thermal stress relaxation portions on the back metal plate. The thermal stress relaxation portions are formed by steps, grooves, or recesses that have a predetermined depth. The number and the size of the thermal stress relaxation portions are determined such that the volume ratio of the back metal plate to the front metal plate is not more than 0.6.

Japanese Laid-Open Patent Publication No. 2007-173405 discloses a semiconductor module in which, on a joint surface of the back metal plate with the heat sink, a non-joint region formed by holes or grooves and a joint region where no holes or grooves are formed. The area of the joint region is set to be 65% to 85% of the entire joint surface of the back metal plate.

In the semiconductor module disclosed in Japanese Laid-Open Patent Publication No. 2003-17627, the steps, grooves, or recesses, which serve as thermal stress relaxation portions formed on the back metal plate, relax thermal stress generated in the semiconductor module when the temperature changes. Thus, in order to increase the thermal stress relaxing performance, the steps, grooves, or recesses are preferably as large as possible. However, increasing the size of the steps, grooves, or recesses, in turn, reduces the joint area between the back metal plate and the heat sink. This reduces the thermal conductivity of the back metal plate. Thus, the balance between the thermal conductivity and the thermal stress relaxing performance needs to taken into consideration. That is, the larger the steps, grooves, or the recesses forming thermal stress relaxation portions, the lower the heat radiation efficiency becomes. Thus, there is a limit to improvement of the stress relaxation performance.

Likewise, according to the semiconductor module disclosed in Japanese Laid-Open Patent Publication No. 2007-173405, the larger the non-joint region, the lower the thermal conductivity of the back metal plate of the semiconductor module becomes. This puts a limit on improvement of the stress relaxation performance.

Particularly, in the case of a semiconductor device such as a power module, on which a semiconductor element generating a great amount of heat is mounted, there is a demand for improving the function to relax the thermal stress generated in the semiconductor device without lowering the heat radiation efficiency. Japanese Laid-Open Patent Publication No. 2004-6717 discloses a power semiconductor device that includes an insulation substrate, front and back metal plates (low thermal expansion coefficient metal plates) joined to each of the front and back surfaces of the insulation substrate, a power semiconductor element joined to the front surface of the front metal plate by, for example, soldering, and a heat sink coupled to the back metal plate to be thermally conductive with the back metal plate. The back metal plate has a linear expansion coefficient that is of the same order of the linear expansion coefficients of the power semiconductor element and the insulation substrate. The heat sink has a plurality of partitioning walls defined by a plurality of grooves formed in the heat sink. The partitioning walls are arranged in regions that correspond to the insulation substrate. The distal end of each partitioning wall is not fixed. Thus, the rigidity of the heat sink of the power semiconductor device disclosed in the publication is lower than that of a heat sink in which the distal ends of partitioning walls are fixed. Therefore, thermal stress generated in the heat sink and the insulation substrate is reduced by deformation of the heat sink. However, since the partitioning walls are arranged only in a region that corresponds to the insulation substrate through the low thermal expansion coefficient metal plates, the rigidity of the heat sink cannot be made sufficiently low. The heat sink therefore cannot sufficiently reduce thermal stress. Also, Japanese Laid-Open Patent Publication No. 2004-6717 discloses a structure in which partition walls with free distal ends are provided below a region to which the low thermal expansion coefficient metal plates are not joined. However, since the partitioning walls with free distal ends reduce the rigidity of the heat sink, the rigidity of the heat sink, which has a greater widthwise length than that of the low thermal expansion coefficient metal plates, may be lowered below the minimum rigidity required for the heat sink.

Further, Japanese Laid-Open Patent Publication No. 5-299549 discloses a heat transfer cooling device that includes a box and a plurality of partitioning walls. The partitioning walls define a plurality of flow passages in the box. The partitioning walls are arranged along the diagonals of the base of the box, such that the space between adjacent partitioning walls is reduced toward the diagonals. In the heat transfer cooling device disclosed in Japanese Laid-Open Patent Publication No. 5-299549, spaces between adjacent partitioning walls are smaller in a central part of the heat transfer cooling device, where the temperature easily rises, so that the number of the partitioning walls is increased in the central part. Thus, the heat radiation efficiency at the central part of the cooling device is higher than that in the other parts.

However, in the heat transfer cooling device of Japanese Laid-Open Patent Publication No. 5-299549, since a plurality of partitioning walls are arranged from one corner of the cooling device toward another corner at predetermined intervals, the rigidity of the cooling device is increased. Therefore, when the temperature of the heat transfer cooling device changes, the device cannot exert sufficient stress relaxation performance.

Accordingly, it is an objective of the present invention to provide a semiconductor device that is excellent in heat radiating performance and reliably relaxes stress. Another objective of the present invention is to provide a semiconductor device that prevents the rigidity of a heat sink from being lowered.

To achieve the foregoing objective and in accordance with a first aspect of the present invention, a semiconductor device including an insulation substrate, a metal wiring layer, a semiconductor element, a heat sink, and a stress relaxation member is provided. The insulation substrate has a first surface and a second surface that is opposite to the first surface. The metal wiring layer is joined to the first surface of the insulation substrate. The semiconductor element is joined to the metal wiring layer. The heat sink is arranged on the second surface of the insulation substrate. The stress relaxation member is made of a material having a high thermal conductivity. The stress relaxation member is located between the insulation substrate and the heat sink in such manner as to couple the insulation substrate and the heat sink such that heat can be conducted therebetween. The heat sink has a plurality of partitioning walls that extend in one direction and are arranged at intervals. The stress relaxation member has a stress absorbing portion that is formed by a hole. The hole either extends through the entire thickness of the stress relaxation member or opens in one of both surfaces in the direction of the thickness. The hole is formed such that its dimension along the longitudinal direction of the partitioning walls is greater than its dimension along the arranging direction of the partitioning walls.

In accordance with a second aspect of the present invention, a semiconductor device including an insulation substrate, a metal wiring layer, a semiconductor element, a heat sink, and a stress relaxation member is provided. The insulation substrate has a first surface and a second surface that is opposite to the first surface. The metal wiring layer is joined to the first surface of the insulation substrate. The semiconductor element is joined to the metal wiring layer. The heat sink is arranged on the second surface of the insulation substrate. The stress relaxation member is made of a material having a high thermal conductivity. The stress relaxation member is located between the insulation substrate and the heat sink in such manner as to couple the insulation substrate and the heat sink such that heat can be conducted therebetween. The heat sink has a plurality of partitioning walls that extend in one direction and are arranged at intervals. The stress relaxation member has a stress absorbing portion. The stress absorbing portion includes a plurality of groups of through holes extending through the entire thickness of the stress relaxation member. The through holes are arranged along the longitudinal direction of the partitioning walls. Each of all the through holes is formed such that its opening dimension along the arranging direction of the partitioning walls is greater than its opening dimension along the longitudinal direction of the partitioning walls. In each of the groups of through holes, the sum of the opening dimensions of the through holes along the longitudinal direction of the partitioning walls is longer than the maximum width of the stress absorbing portion along the arranging direction of the partitioning walls.

In accordance with a third aspect of the present invention, a semiconductor device including an insulation substrate, a first metal plate, a semiconductor element, a second metal plate, and a heat sink is provided. The insulation substrate has a first surface and a second surface that is opposite to the first surface. The first metal plate is joined to the first surface of the insulation substrate. The semiconductor element is joined to the first metal plate. The second metal plate is joined to the second surface of the insulation substrate. The heat sink cools the semiconductor element, and is coupled to the second metal plate such that heat can be conducted. The heat sink includes a case portion and a plurality of partitioning walls located in the case portion. The partitioning walls define a plurality of cooling medium passages. The case portion has a surface that faces the second metal plate, which surface includes a joint region, to which the second metal plate is joined, and a non-joint region, to which the second metal plate is not joined. Each partitioning wall includes a first end facing the second metal plate and a second end opposite to the first end. The partitioning walls include first partitioning walls and second partitioning walls. The first end of each first partitioning wall is joined to an inner surface of the case portion. The second end of each first partitioning wall is not joined to an inner surface of the case portion. The first and second ends of each second partitioning wall are joined to inner surfaces of the case portion. Among the first and second partitioning walls, at least one or more of the first partitioning walls pass through a region in the case portion that corresponds to the joint region. Among the first and second partitioning walls, only one or more of the second partitioning walls pass through a region in the case portion that corresponds to the non-joint region.

In accordance with a fourth aspect of the present invention, a semiconductor device including an insulation substrate, a first metal plate, a semiconductor element, a second metal plate, and a heat sink is provided. The insulation substrate has a first surface and a second surface that is opposite to the first surface. The first metal plate is joined to the first surface of the insulation substrate. The semiconductor element is joined to the first metal plate. The second metal plate is joined to the second surface of the insulation substrate. The heat sink cools the semiconductor element, and is coupled to the second metal plate such that heat can be conducted. The heat sink includes a case portion and a plurality of partitioning walls located in the case portion. The partitioning walls define a plurality of cooling medium passages. All the partitioning walls are located in a region in the case portion that is directly below the semiconductor element.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3A is a schematic partial plan view illustrating a semiconductor device according to a modification of the first embodiment;

FIG. 3B is a schematic partial plan view illustrating a semiconductor device according to a modification of the first embodiment;

FIG. 3C is a schematic partial plan view illustrating a semiconductor device according to a modification of the first embodiment;

DETAILED DESCRIPTION OF THE PREFERRED EMBODIMENTS

Figure 1:
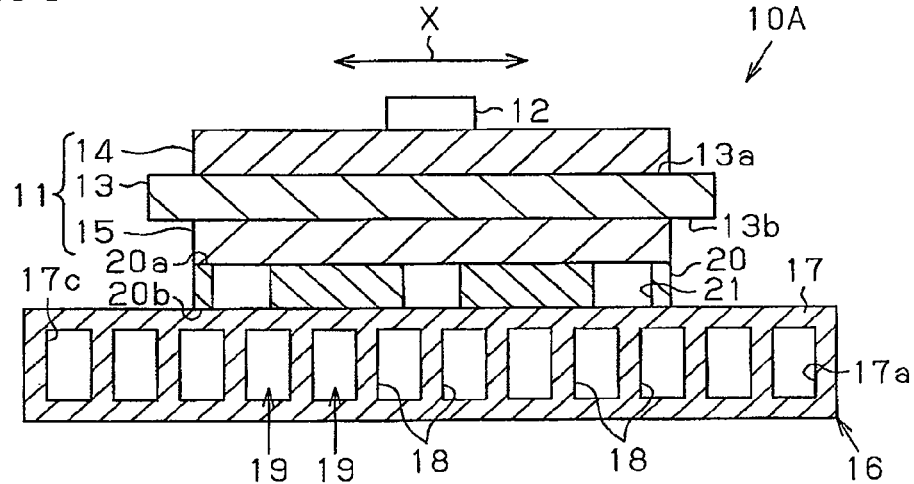
FIG. 1 is a schematic cross-sectional view illustrating a semiconductor device according to a first embodiment of the present invention.

A first embodiment of the present invention will now be described with reference to FIGS. 1 to 3C. Each of the FIGS. 1 to 3C schematically shows the structure of a semiconductor device 10A according to the first embodiment. For the illustrative purposes, the dimensions of some of the elements are exaggerated. That is, the ratios of the widths, lengths, and thicknesses of some of the elements of the semiconductor device 10A in the drawings are not to scale. The semiconductor device 10A is mounted on a vehicle.

As shown in FIG. 1, the semiconductor device 10A includes a circuit substrate 11, a semiconductor element (semiconductor chip) 12 mounted on the circuit substrate 11, a heat sink 16, and a stress relaxation member 20 located between the circuit substrate 11 and the heat sink 16. The circuit substrate 11 includes a ceramic substrate 13, which is an insulation substrate, a first metal plate (a metal circuit board) joined to a front surface 13a (a first surface) of the ceramic substrate 13, and a second metal plate 15 joined to a back surface 13b (a second surface) of the ceramic substrate 13. The first metal plate 14 and the second metal plate 15 are made of, for example, aluminum or copper.

The upper surface of the ceramic substrate 13 as viewed in FIG. 1 is the front surface 13a, on which the semiconductor element 12 is mounted. Also, the first metal plate 14, which serves as a wiring layer, is joined to the front surface 13a. The semiconductor element 12 is joined to the first metal plate 14 with solder, which is not illustrated. The semiconductor element 12 is, for example, an IGBT (Insulated Gate Bipolar Transistor), a MOSFET, or a diode.

The second metal plate 15 is joined to the lower surface of the ceramic substrate 13 as viewed in FIG. 1, or the back surface 13b. The second metal plate 15 functions as a coupling layer for coupling the ceramic substrate 13 and the heat sink 16 to each other.

The heat sink 16 is made of metal and functions as a forced-cooling cooler that forcibly removes heat generated in the semiconductor element 12. The cooling capacity of the heat sink 16 is set such that, when the semiconductor element 12 is steadily generating heat (a normal state), the heat generated in the semiconductor element 12 is conducted to the heat sink 16 via the circuit substrate 11, and as a result, the heat is smoothly removed. The heat sink 16 is formed to be rectangular in a planar view, such that the longitudinal direction of the heat sink 16 corresponds to arrow direction X in FIG. 2, and the transverse direction of the heat sink 16 corresponds to arrow direction Y in FIG. 2. The outer shell of the heat sink 16 is formed by a hollow flat case portion 17.

Figure 2:
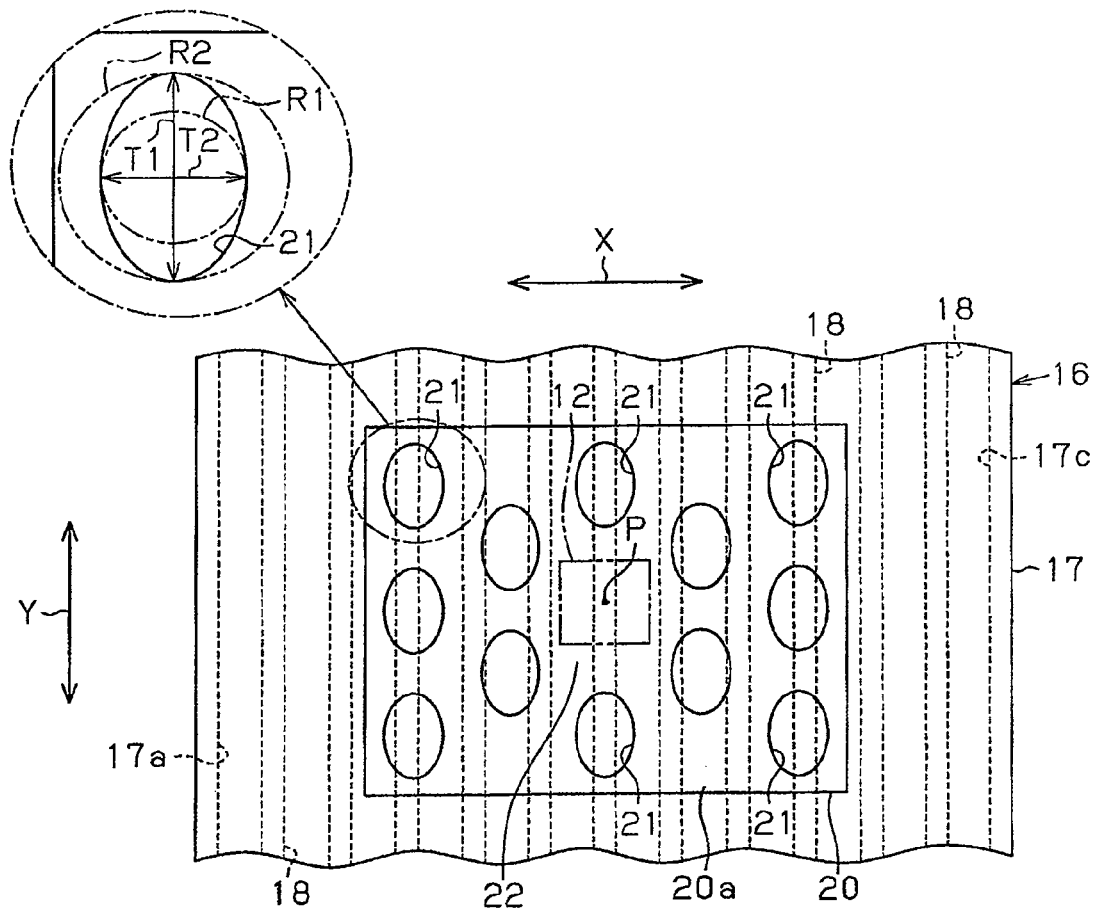
FIG. 2 is a schematic plan view of the semiconductor device shown in FIG. 1.

A plurality of partitioning walls 18 are provided in the case portion 17. The partitioning walls 18 linearly extend along the transverse direction of the heat sink 16, that is, along arrow direction Y in FIG. 2. As shown in FIGS. 1 and 2, the partitioning walls 18 are arranged along the longitudinal direction of the heat sink 16, or in arrow direction X of FIG. 2, at equal intervals, and extend parallel with each other. Adjacent pairs of the partitioning walls 18, and the outermost partitioning walls 18 and inner wall surfaces 17c of the case portion 17 define cooling medium passages 19, through which fluid (for example, cooling water) flows. The stress relaxation member 20 is located between the heat sink 16 and the second metal plate 15 of the circuit substrate 11. The stress relaxation member 20 couples the circuit substrate 11 and the heat sink 16 to each other.

The stress relaxation member 20 is made of a material having a high thermal conductivity. In this embodiment, the stress relaxation member 20 is made of aluminum. The stress relaxation member 20 is formed into a flat plate that is rectangular in a planar view. A first surface 20a of the stress relaxation member 20 is entirely brazed to the second metal plate 15, and a second surface 20b is entirely brazed to the heat sink 16. That is, joint portions made of brazing filler metal are formed between the stress relaxation member 20 and the second metal plate 15 and between the stress relaxation member 20 and the heat sink 16. Thus, the circuit substrate 11 and the heat sink 16 are coupled to each other such that heat can be conducted therebetween via the stress relaxation member 20. Heat generated in the semiconductor element 12 is conducted to the heat sink 16 via the circuit substrate 11 and the stress relaxation member 20 in this order. Also, the stress relaxation member 20 has through holes 21, the number of which is twelve in this embodiment. The through holes 21 function as stress absorbing portions and extend through the stress relaxation member 20 only along the thickness. Each through hole 21 has an elliptic shape in a planar view.

The through holes 21 are formed by pressing (machining) a flat plate that constitutes the stress relaxation member 20. As shown in FIG. 2, each through hole 21 is formed such that a dimension T1 along the longitudinal direction of the partitioning walls 18, or along arrow direction Y, is greater than a dimension T2 along the direction in which the partitioning walls 18 are arranged (arranging direction), or along arrow direction X in FIGS. 1 and 2. All the through holes 21 have the same shapes. Two or more of the through holes 21 are arranged along the longitudinal direction of the partitioning walls 18, or along arrow direction Y. The major axis of each through hole 21 extends parallel with the longitudinal direction of the partitioning walls 18, and the minor axis of each through hole 21 extends parallel with the arranging direction of the partitioning walls 18. Therefore, the stress relaxation member 20 is more easily deformed along the longitudinal direction of the partitioning walls 18 than along the arranging direction of the partitioning walls 18. The through holes 21 are symmetrical with respect to a reference point P on the stress relaxation member 20, which reference point P corresponds to the center of the semiconductor element 12. No through hole 21 is formed in a part of the stress relaxation member 20 that is directly below the semiconductor element 12. That is, the through holes 21 are arranged so as not to overlap the semiconductor element 12 in a planar view. The part of the stress relaxation member 20 that is directly below the semiconductor element 12 is closest to the semiconductor element 12, and serves as a thermally conductive portion 22, which has a better thermal conductivity than the through holes 21.

Operation of the semiconductor device 10A will now be described.

The semiconductor device 10A of the present embodiment is mounted on a hybrid vehicle, and the heat sink 16 is connected to a cooling medium circuit (not shown) of the vehicle through pipes. The cooling medium circuit has a pump and a radiator. The radiator has a fan that is driven by a motor. The radiator thus has a superior radiation efficiency. The cooling medium is, for example, water.

When the semiconductor element 12 mounted on such a semiconductor device 10A is actuated, the semiconductor element 12 generates heat. The heat generated in the semiconductor element 12 is conducted to the heat sink 16 through the first metal plate 14, the ceramic substrate 13, the second metal plate 15, the stress relaxation member 20, and the heat sink 16. The part of the stress relaxation member 20 that is directly below the semiconductor element 12 is the thermally conductive portion 22, which has no through hole 21. Thus, the heat transmitted to the stress relaxation member 20 is smoothly conducted to the heat sink 16.

As a result, the circuit substrate 11 and the heat sink 16 are heated to high temperature and thermally expanded. At this time, if through holes formed in the stress relaxation member 20 are like a hypothetic hole R1, which is shown by an alternate long and two short dashes line in FIG. 2 and formed like a perfect circle, the stress due to thermal expansion generated along the longitudinal direction of the partitioning walls 18 in a part between the heat sink 16 and the ceramic substrate 13 is greater than the stress due to the thermal expansion generated along the arranging direction of the partitioning walls 18. That is, since the coefficient of linear expansion of the ceramic substrate 13 and the coefficient of linear expansion of the metal members (the heat sink 16 and the first and second metal plates 14, 15) are different, thermal stress is generated in the semiconductor device 10A. Particularly, a great thermal stress along the longitudinal direction of the partitioning walls 18 is generated between the heat sink 16 and the ceramic substrate 13. If the through holes are enlarged like a hypothetical hole R2 in order to relax the thermal stress along the longitudinal direction of the partitioning walls 18, the joint area between the stress relaxation member 20 and the heat sink 16 will be reduced, and the thermal conductivity of the stress relaxation member 20 will therefore be lowered. The shape of the through holes 21 in the present embodiment is determined taking into consideration the arranging direction of the partitioning walls 18 of the heat sink 16. Since the stress relaxation member 20 of the present embodiment is more easily deformed in the longitudinal direction of the partitioning walls 18 than in the arranging direction of the partitioning walls 18, the stress relaxation member 20 thus more effectively relaxes the thermal stress in the longitudinal direction of the partitioning walls 18 than the thermal stress in the arranging direction. As a result, the thermal stress along the longitudinal direction of the partitioning walls 18 is equalized with the thermal stress along the arranging direction. Therefore, the through holes do not need to be enlarged more than necessary. This prevents the thermal conductivity of the stress relaxation member 20 from being lowered. Further, when the temperature of the semiconductor device 10A is raised, it is possible to inhibit the joint portions between the ceramic substrate 13 and the second metal plate 15 from cracking, and the joint surface of the heat sink 16 that faces the circuit substrate 11 from warping.

When the semiconductor element 12 stops generating heat, the temperature of the ceramic substrate 13 and the heat sink 16 is lowered, and the ceramic substrate 13 and heat sink 16 are thermally shrunk. At this time, since the stress relaxation member 20 is more easily deformed in the longitudinal direction of the partitioning walls 18 than in the arranging direction of the partitioning walls 18, the thermal stress between the heat sink 16 and the second metal plate 15 is relaxed by a greater degree along the longitudinal direction of the partitioning walls 18 than along the arranging direction of the partitioning walls 18. Therefore, when the temperature of the semiconductor device 10A is lowered, it is possible to inhibit the joint portions between the ceramic substrate 13 and the second metal plate 15 from cracking, and the joint surface of the heat sink 16 that faces the circuit substrate 11 from warping.

Also, when the heat generated in the semiconductor element 12 is conducted to the heat sink 16, heat exchange takes place between the cooling medium flowing through the cooling medium passages 19, and the case portion 17 and the partitioning walls 18, so that the heat is removed by the cooling medium. That is, since the heat sink 16 is forcibly cooled by the cooling medium flowing through the cooling medium passages 19, the temperature gradient of the conduction path of heat from the semiconductor element 12 to the heat sink 16 is increased. This allows the heat generated in the semiconductor element 12 to be efficiently removed through the circuit substrate 11.

The present embodiment has the following advantages.

(1) The stress relaxation member 20 has a plurality of through holes 21. The dimension T1 of each through hole 21 along the longitudinal direction of the partitioning walls 18 is greater than the dimension T2 of the through hole 21 along the arranging direction of the partitioning walls 18. Therefore, the stress relaxation member 20 is more easily deformed in the longitudinal direction of the partitioning walls 18 than in the arranging direction of the partitioning walls 18. As a result, the thermal stress along the longitudinal direction of the partitioning walls 18 is equalized with the thermal stress along the arranging direction.

(2) The dimension T2 of each through holes 21 along the arranging direction of the partitioning walls 18 is shorter than the dimension T1 along the longitudinal direction of the partitioning walls 18. Thus, compared to the case where the hypothetical hole R1 is enlarged to the hypothetical hole R2 in order to improve the stress relaxation performance of the stress relaxation member 20, the joint area between the heat sink 16 and the stress relaxation member 20 is inhibited from being reduced. Therefore, the heat generated in the semiconductor element 12 is smoothly conducted through the stress relaxation member 20 and reaches the heat sink 16. This prevents the thermal conductivity of the stress relaxation member 20 from being lowered.

(3) The second metal plate 15 is joined to the back surface 13b of the ceramic substrate. The stress relaxation member 20, which is a separate component from the circuit substrate 11, is provided between the heat sink 16 and the second metal plate 15 of the circuit substrate 11. Therefore, the stress relaxation member 20 is manufactured independently from the semiconductor element 12 and the ceramic substrate 13. The through holes 21 of the stress relaxation member 20 are easily formed by, for example, machining such as pressing a plate member. Therefore, when forming the through holes 21, the influence on the semiconductor element 12 and the ceramic substrate 13 does not need to be taken into consideration.

(4) A part of the stress relaxation member 20 that is directly below the semiconductor element 12 serves as the thermally conductive portion 22, through which the heat generated in the semiconductor element 12 passes, and the thermally conductive portion 22 has no through holes 21. That is, a part of the stress relaxation member 20 to which the heat generated in the semiconductor element 12 reaches first is formed as the thermally conductive portion 22 having no through holes 21. Therefore, the heat generated in the semiconductor element 12 is smoothly conducted through the stress relaxation member 20 and reaches the heat sink 16.

(5) The through holes 21 extend along the thickness of the stress relaxation member 20. Therefore, compared to a case where a stress relaxation member is manufactured by forming a plurality of bottomed holes in a plate member made of a material having a high thermal conductivity, the stress relaxation member 20 is formed to be more easily deformed.

The first embodiment is not limited to the above described configuration, but may be embodied as follows, for example.

The major axis of the through holes 21 do not need to be parallel with the longitudinal direction of the partitioning walls 18. it is sufficient if the dimension T1 along the longitudinal direction of the partitioning walls 18 is longer than the dimension T2 along the arranging direction of the partitioning walls 18. For example, elliptic through holes may be formed that has a major axis intersecting the longitudinal direction of the longitudinal direction of the partitioning walls 18.

The number of the through holes 21 is not limited to that according to the first embodiment. When a large sized stress relaxation member 20 is used, the number of through holes 21 may be increased.

The shape of the through holes 21 may be changed. The size of the through holes 21 may be reduced or increased as long as the dimension T1 along the longitudinal direction of the partitioning walls 18 is longer than the dimension T2 along the arranging direction of the partitioning walls 18. Therefore, for example, through holes 21 may be formed in which the dimension T2 along the arranging direction of the partitioning walls 18 is longer than the diameter of the hypothetical hole R1.

The shape of the through holes 21 is not limited to that according to the first embodiment. For example, as shown in FIG. 3A, through holes 30 that have a rectangular shape in a planar view may be formed. A dimension T3 of each through hole 30 along the longitudinal direction of the partitioning walls 18 is longer than a dimension T4 along the arranging direction of the partitioning walls 18. Also, as shown in FIG. 3B, through holes 31 may be formed by connecting each set of the through holes 30 shown in FIG. 3A along the longitudinal direction of the partitioning walls 18. In this case, a part of the stress relaxation member 20 that is directly below the semiconductor element 12 needs to be formed as a thermally conductive portion 22, where no through hole 31 exists.

Each stress absorbing portion may be a group of holes, in which holes extend through the thickness of the stress relaxation member 20 and are arranged along the longitudinal direction of the partitioning walls 18. For example, as shown in FIG. 3C, each through hole 21 of the stress relaxation member 20 may be replaced by a group of holes 40. Each group of holes 40 includes a plurality of holes 41 (three in FIG. 3C). Each through hole 41 is rectangular such that its opening dimension t1 along the longitudinal direction of the partitioning walls 18 is shorter than its dimension t2 along the arranging direction of the partitioning walls 18. The through holes 41 forming each group of holes 40 are arranged along the longitudinal direction of the partitioning walls 18. Each group of holes 40 is formed such that the sum of the dimensions t1 along the longitudinal direction of the partitioning walls 18 is greater than the dimension t2 of each through hole 41 (the dimension of the stress absorbing portion) along the arranging direction of the partitioning walls 18. Also, the distance H1 between adjacent groups of holes 40 along the longitudinal direction of the partitioning walls 18 is greater than the distance H2 between adjacent holes 41 in each group of hole 40 along the longitudinal direction of the partitioning walls 18. Since the stress relaxation member 20 having a plurality of the groups of holes 40 is easily deformed in the longitudinal direction of the partitioning walls 18, the stress relaxation member 20 effectively relaxes the thermal stress along the longitudinal direction of the partitioning walls 18, which improves the stress relaxation performance. Further, since each stress absorbing portion is formed by a group of holes 40, which includes through holes 41 extending through the thickness of the stress relaxation member 20, the stress relaxation member 20 is more easily and effectively deformed than a stress absorbing portion formed by bottomed holes. Also, as long as the maximum value of the length (dimension) of each group of holes 40 along the arranging direction of the partitioning walls 18 is less than the sum the dimensions t1 along the longitudinal direction of the partitioning walls 18, the through holes 41 in each group of holes 40 may be arranged along the longitudinal direction of the partitioning walls 18 while being slightly displaced in the arranging direction of the partitioning walls 18.

The positions of the through holes 21 on the stress relaxation member 20 are not limited to those according to the first embodiment. For example, the through holes 21 may be arranged zigzag.

The through holes 21 as stress absorbing portions may be replaced by bottomed holes, each having an opening only on one of the surfaces of the stress relaxation member 20 in the direction of thickness. The length (opening dimension) of each bottomed hole along the longitudinal direction of the partitioning walls 18 may be set arbitrarily as long as it is longer than the length (opening dimension) along the arranging direction of the partitioning walls 18. The bottomed holes may open, for example, in the second surface 20b of the stress relaxation member 20. When bottomed holes are formed in the stress relaxation member 20 instead of through holes 21, the depth of the bottomed holes is not particularly limited as long as the stress relaxation member 20 sufficiently relaxes thermal stress generated in the semiconductor device 10A.

The second metal plate 15 may also function as the stress relaxation member 20. For example, the stress relaxation member 20 may be omitted, and a plurality of holes may be formed in a surface of the second metal plate 15 that faces the heat sink 16. The dimension of each hole along the longitudinal direction of the partitioning walls 18 is longer than the dimension along the arranging direction of the partitioning walls 18. According to this configuration, the second metal plate 15 functions as a stress relaxation member that relaxes thermal stress generated in the semiconductor device 10A when the temperature of the semiconductor device 10A changes. Also, since the second metal plate 15 can be greatly deformed in the longitudinal direction of the partitioning walls 18 compared to a conventional stress relaxation member having a stress absorbing portions formed by perfect-circle shaped holes in a planar view, the second metal plate 15 has an improved stress relaxation performance.

The direction in which the partitioning walls 18 extend is not limited to that in the first embodiment. As long as the partitioning walls 18 extend in a single direction, the extending direction is not particularly limited. For example, the partitioning walls 18 may extend in a direction intersecting the transverse direction of the heat sink 16.

The partitioning walls 18 may be continuous along the arranging direction. For example, corrugated fins may be used in which a plurality of partitioning walls 18 are continuously formed in the arranging direction of the partitioning walls 18. In corrugated fins, the upper ends or the lower ends of each adjacent pair of the partitioning walls 18 are continuous.

The structure of the heat sink 16 is not limited to that described in the first embodiment. For example, the case portion 17 may be replaced by a plate-like heat sink base. The heat sink base has a first surface opposite to the semiconductor element 12, and a second surface opposite to the first surface. The heat sink base has a plurality of partitioning walls 18 on the first surface, and the stress relaxation member 20 is joined to the second surface.

A second embodiment of the present invention will now be described with reference to FIGS. 4 to 7. The differences from the first embodiment will mainly be discussed below. Each of the FIGS. 4 to 7 schematically shows the structure of a semiconductor device 10B according to the second embodiment. For the illustrative purposes, the dimensions of some of the elements are exaggerated. That is, the ratios of the widths, lengths, and thicknesses of some of the elements of the semiconductor device 10B in the drawings are not to scale. The semiconductor device 10B is mounted on a vehicle.

In a heat sink 16 of the present embodiment, a front surface 17a of a case portion 17 includes a joint region S, to which a second metal plate 15 is joined by brazing filler metal (not shown), and a non-joint region P encompassing the joint region S. The second metal plate 15 is not joined to the non-joint region P. The case portion 17 has a back surface 17b on the opposite side to the front surface 17a. Linearly extending straight first partitioning walls 18A and second partitioning walls 18B are formed in the case portion 17 of the present embodiment.

Figure 4:
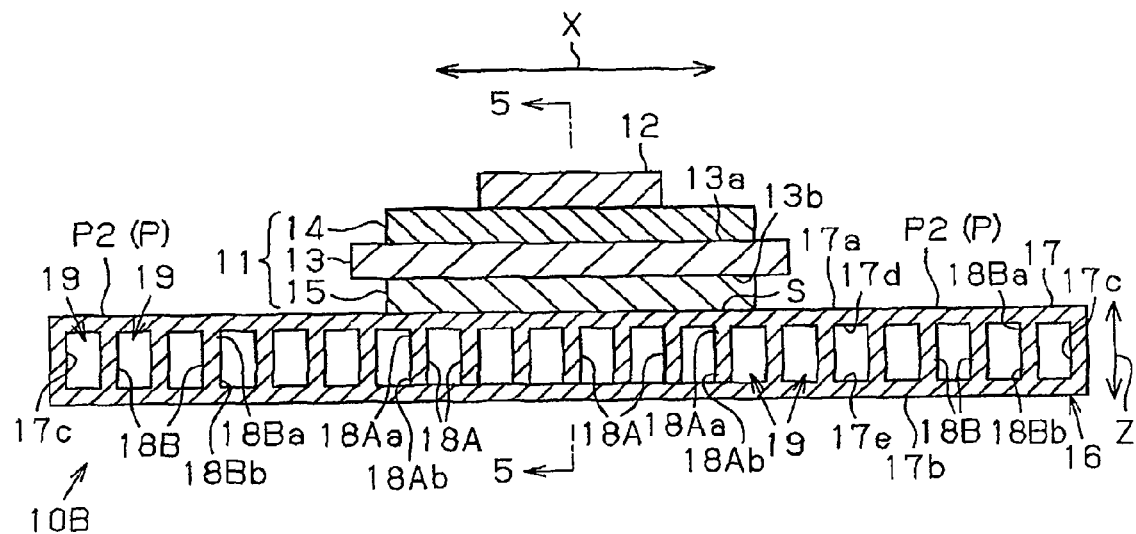
FIG. 4 is a schematic cross-sectional view illustrating a semiconductor device according to a second embodiment of the present invention.

The first partitioning walls 18A and the second partitioning walls 18B are arranged at equal intervals along the longitudinal direction of the heat sink 16, or along arrow direction X in FIG. 4, and are parallel with each other. Adjacent pairs of the first and second partitioning walls 18A and 18B, and the outermost second partitioning walls 18B and inner wall surfaces 17c of the case portion 17 define cooling medium passages 19, through which cooling medium flows. The cooling medium passages 19 are formed to have the same cross-sectional flow area.

Figure 5:
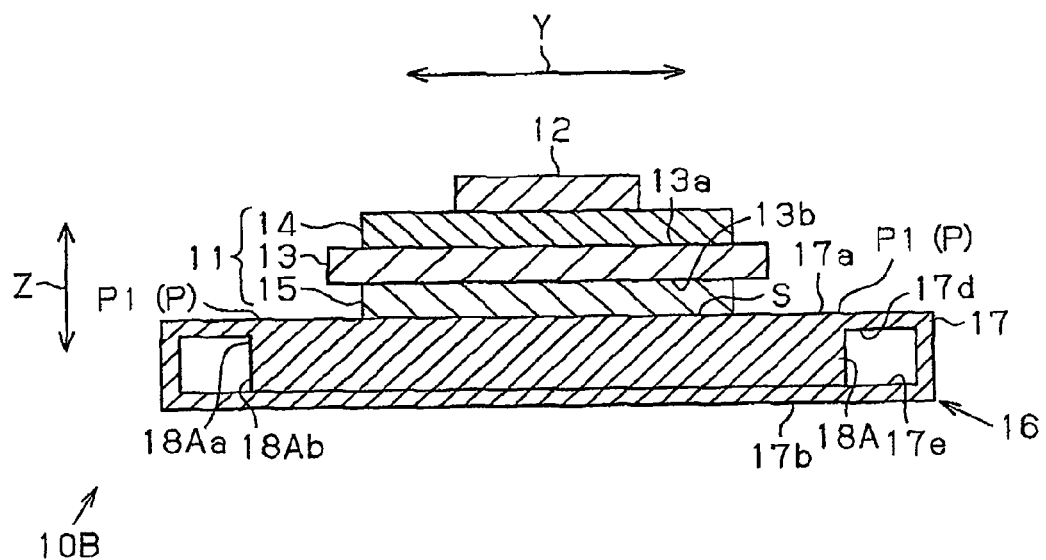
FIG. 5 is a schematic cross-sectional view taken along line 5-5 in FIG. 4.

The first partitioning walls 18A are located in a region in the case portion 17 that is directly below the joint region S in the lamination direction (arrow direction Z in FIG. 5), and in a region in the case portion 17 that corresponds to the non-joint region P (hereinafter, a first non-joint region P1), which extends from the joint region S along the extending direction of the partitioning walls 18A, 18B (arrow direction Y in FIG. 5). Each first partitioning wall 18A has an upper end 18Aa, which is a first end, at a side closer to the semiconductor element 12. Each upper end 18Aa is joined to an upper inner surface 17d of the case portion 17. As shown in FIGS. 4 and 5, each first partitioning wall 18A has a lower end 18Ab, which is a second end, at a side opposite to the first end. The lower end 18Ab of each first partitioning wall 18A contacts but is not joined to the lower inner surface 17e of the case portion 17 over the extending direction of the first partitioning walls 18A, that is, over arrow direction Y in FIG. 5. That is, only the first partitioning walls 18A exist in a region in the case portion 17 that is directly below the joint region S. The upper end 18Aa of each first partitioning wall 18A and the upper inner surface 17d of the case portion 17 are joined by brazing filler metal (not shown). Contrastingly, no brazing filler metal exists between the lower end 18Ab of each first partitioning wall 18A and the lower inner surface 17e of the case portion 17. That is, the lower end 20b and the lower inner surface 17e are not joined to each other.

Also, as shown FIG. 4, all the second partitioning walls 18B are located in a region in the case portion 17 that corresponds to a second non-joint region P2, which is a region other than the regions S, P1. The upper end 18Ba of each second partitioning wall 18B and the upper inner surface 17d of the case portion 17 are joined by brazing filler metal (not shown). Also, the lower end 18Bb of each second partitioning wall 18B and the lower inner surface 17e of the case portion 17 are joined by brazing filler metal (not shown). The cooling medium passages 19, which are defined by the first partitioning walls 18A and the second partitioning walls 18B, connect an inlet and outlet (neither is shown) provided in the case portion 17. The inlet and outlet are formed to be connectable with a cooling medium circuit installed in the vehicle. For the illustrative purpose, the circuit substrate 11 and the semiconductor element 12 exemplify multiple circuit substrates 11 and semiconductor elements 12 mounted on the heat sink 16.

Operation of the semiconductor device 10B will now be described.

The semiconductor device 10B is mounted on a hybrid vehicle, and the heat sink 16 is connected to a cooling medium circuit (not shown) of the vehicle through pipes. The cooling medium circuit has a pump and a radiator. The radiator has a fan that is driven by a motor. The radiator thus has a superior radiation efficiency. The cooling medium is, for example, water.

When the semiconductor element 12 mounted on the semiconductor device 10B is actuated, heat is generated from the semiconductor element 12. The heat generated in the semiconductor element 12 is conducted to the heat sink 16 through the first metal plate 14, the ceramic substrate 13, the second metal plate 15, and the heat sink 16. When the heat is conducted from the semiconductor element 12 to the heat sink 16, the circuit substrate 11 and the heat sink 16 are heated to high temperature and thermally expanded. At this time, since the coefficient of linear expansion of the ceramic substrate 13 and the coefficient of linear expansion of the metal members (the heat sink 16 and the first and second metal plates 14, 15) are different, the amount of expansion is different between the heat sink 16, and the first and second metal plates 14, 15. However, the heat sink 16 is deformed to relax the thermal stress generated in the semiconductor device 10B. Further, since the rigidity of the portion of the heat sink 16 of the present embodiment that corresponds to the joint region S is particularly low, the portion that corresponds to the joint region S is particularly easily deformed. As a result, the heat sink 16 sufficiently relaxes the thermal stress generated in the semiconductor device 10B. Therefore, when the temperature of the ceramic substrate 13 and heat sink 16 increases, it is possible to inhibit the joint portions between the ceramic substrate 13 and the second metal plate 15 from cracking, and the joint surface of the heat sink 16 that faces the circuit substrate 11 from warping.

When the semiconductor element 12 stops generating heat, the temperature of the ceramic substrate 13 and the heat sink 16 is lowered, and the ceramic substrate 13 and heat sink 16 are thermally shrunk. At this time, being easily deformed, the heat sink 16 relaxes the thermal stress generated in the semiconductor device 10B. Therefore, when the temperature of the ceramic substrate 13 and heat sink 16 lowers, it is possible to inhibit the joint portions between the ceramic substrate 13 and the second metal plate 15 from cracking, and the joint surface of the heat sink 16 that faces the circuit substrate 11 from warping.

Also, when the heat generated in the semiconductor element 12 is conducted to the heat sink 16, heat exchange takes place between the cooling medium flowing through the cooling medium passages 19 and the case portion 17, and between the cooling medium and the first and second partitioning walls 18A, 18B, so that the heat is removed by the cooling medium. That is, since the heat sink 16 is forcibly cooled by the cooling medium flowing through the cooling medium passages 19, the temperature gradient of the conduction path of heat from the semiconductor element 12 to the heat sink 16 is increased. This allows the heat generated in the semiconductor element 12 to be efficiently removed through the circuit substrate 11.

The first partitioning walls 20 hardly contribute to improve the rigidity of the heat sink 16. If partition walls having the same structure as the first partitioning walls 18A are arranged in a region in the case portion 17 that corresponds to the second non-joint region P2, the rigidity of the heat sink 16 will be lower than a predetermined acceptable value, and therefore, the shape of the case portion 17 cannot be maintained. However, according to the present embodiment, the upper end 18Ba and the lower end 18Bb of each of the partitioning walls 18B in a region of the case portion 17 that corresponds to the second non-joint region P2 are joined to the inner surfaces 17d, 17e of the case portion 17. Since the second partitioning walls 18B have a function to inhibit deformation of the case portion 17, the rigidity of the heat sink 16 is inhibited from being excessively lowered. The rigidity of the heat sink 16 is therefore maintained to an appropriate level. As a result, although the rigidity of the heat sink 16 is lowered as much as possible in the allowable range so that the heat sink 16 exerts a sufficient thermal stress relaxation performance, the rigidity is not excessively lowered to a detrimental level.

The present embodiment has the following advantages.

(1) The first partitioning walls 18A, which serve as partitioning walls, are located in a region in the case portion 17 that corresponds to the joint region S. The second partitioning walls 18B are located in a region in the case portion 17 that corresponds to the second non-joint region P2 in the non-joint region P. Therefore, compared to a heat sink in which partitioning walls are located only in the joint region S and the first non-joint region P1, that is, compared to a heat sink in which no partitioning walls are located in the second non-joint region P2, the heat sink 16 has a lower rigidity. As a result, the thermal stress generated in the semiconductor device 10B is relaxed.

(2) The upper end 18Ba and the lower end 18Bb of each of the second partitioning walls 18B, which are only provided in a region in the case portion 17 that corresponds to the second non-joint region P2, are both joined to the inner surface of the case portion 17. Therefore, the rigidity of the heat sink 16 is not excessively lowered.

(3) The upper end 18Aa of each first partitioning wall 18A is joined to the upper inner surface 17d of the case portion 17, whereas the lower end 20b of each first partitioning wall 18A is not joined to the lower inner surface 17e of the case portion 17. Therefore, a portion of the heat sink 16 that corresponds to the joint region S and the first non-joint region P1 has a lower rigidity than a portion that corresponds to the second non-joint region P2. As a result, since a part of the joint region S of the heat sink 16 that is close to the ceramic substrate 13 is more easily deformed than the second non-joint region P2, thermal stress due to the difference in the coefficient linear expansion between the ceramic substrate 13 and the heat sink 16 is effectively relaxed.

(4) A partitioning wall that passes through a region in the case portion 17 that corresponds to the second non-joint region P2 is only the second partitioning walls 18B. Therefore, the rigidity of the heat sink 16 is effectively prevented from being excessively lowered.

(5) All the partition walls that pass through the joint region S and the first non-joint region P1 are the first partitioning walls 18A. Therefore, compared to a case where, for example, second partitioning walls 18B is provided in the joint region S in addition to first partitioning walls 18A, the rigidity of the heat sink 16 is further lowered.

(6) The lower end 20b of each first partitioning walls 18A directly contacts the lower inner surface of the case portion 17. Therefore, the heat transmitted to the first partitioning walls 18A can be transmitted from the lower ends 20b to the case portion 17. This allows the heat to be smoothly transmitted to the entire heat sink 16.

The second embodiment is not limited to the above described configuration, but may be embodied as follows, for example.

It is sufficient if only a part of the lower end 20b of each first partitioning wall 18A that is directly below the joint region S is not joined to the lower inner surface 17e of the case portion 17. For example, it may be configured that, in each first partitioning wall 18A, only the lower end 20b, which is directly below the joint region S, is not joined to the lower inner surface 17e of the case portion 17, and that the lower end 20b that is directly below first non-joint region P1 contacts the lower inner surface 17e of the case portion 17.

Figure 6:
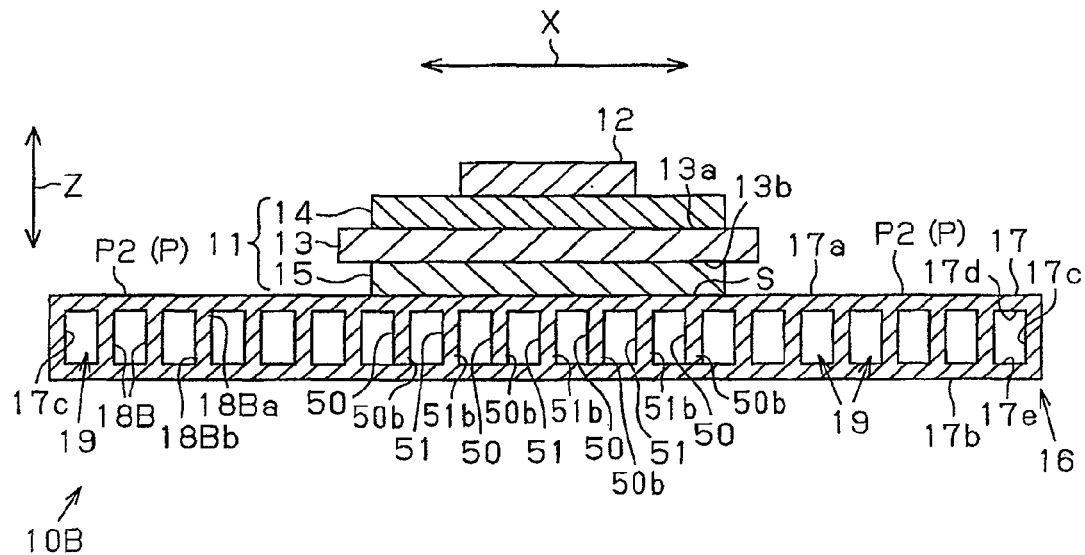
FIG. 6 is a schematic cross-sectional view illustrating a semiconductor device according to a modification of the second embodiment.

The partitioning walls that pass through a region in the case portion 17 that corresponds to the joint region S and the first non-joint region P1 do not need to be only the first partitioning walls 18A. For example, as shown in FIG. 6, first partitioning walls 50, of which the lower ends 20b are not joined to the lower inner surface 17e of the case portion 17, and second partitioning walls 51, of which the lower ends 20b are joined to the lower inner surface 17e of the case portion 17, may be provided in a mixed state in a region in the case portion 17 that corresponds to joint region S. In this case, the first partitioning walls 50 and the second partitioning walls 51 may be arranged alternately at predetermined intervals.

The extending direction of the first partitioning walls 18A is not limited to that described in the second embodiment. For example, the first partitioning walls 18A may be parallel with the longitudinal direction of the heat sink 16, that is, parallel with arrow direction X in FIG. 4. Also, the extending direction of the second partitioning walls 18B may be parallel with the longitudinal direction of the heat sink 16.

The first partitioning walls 18A may be continuous along the arranging direction. Also, the second partitioning walls 18B may be continuous along the arranging direction. The first partitioning walls 18A and the second partitioning walls 18B may be continuous along the arranging direction. Therefore, for example, corrugated fins may be used to form first fins, which serve as the first partitioning walls 18A, and second fins, which serve as the second partitioning walls 18B. The corrugated fins connected such that the upper end of each first fin is continuous with the upper end of an adjacent first fin, and that the lower end of each first fin is continuous with the lower end of an adjacent first fin. Likewise, the upper end of each second fin is continuous with the upper end of an adjacent second fin, and the lower end of each second fin is continuous with the lower end of an adjacent second fin.

Figure 7:
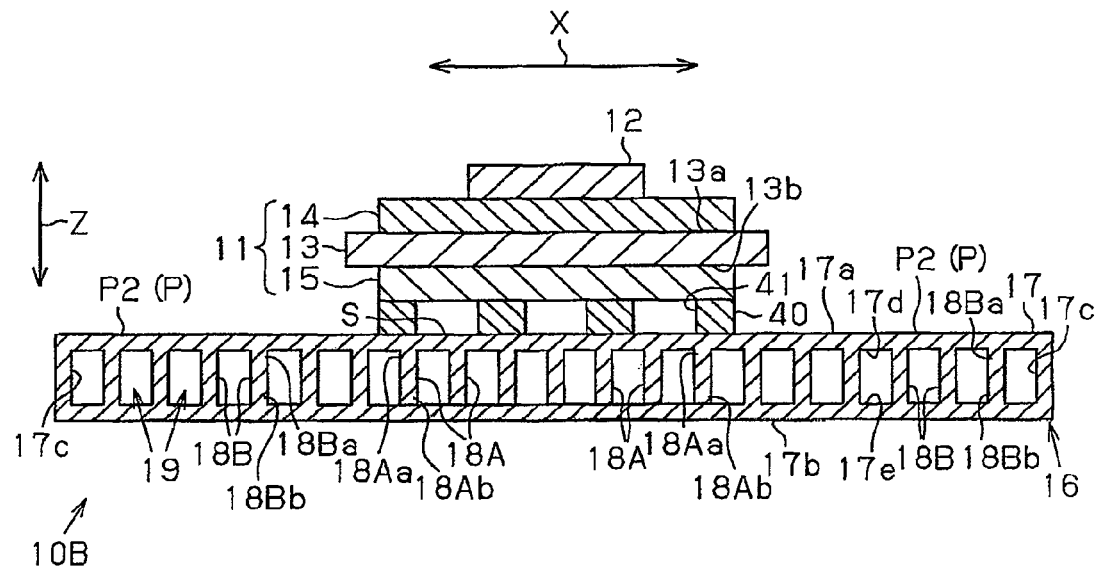
FIG. 7 is a schematic cross-sectional view illustrating a semiconductor device according to a modification of the second embodiment.

As shown in FIG. 7, the stress relaxation member 20 of the first embodiment may be located between the second metal plate 15 and the heat sink 16.

In the heat sink 16, the joint portions between the case portion 17 and the first and second partitioning walls 18A, 18B, 50, 51 are brazed. However, the heat sink 16 may be formed by extrusion molding.

The lower ends 20b, 50b of the first partitioning walls 18A, 50 do not need to contact the inner surface 17e. However, in view of better thermal conductivity, the lower ends 20b, 50b of the first partitioning walls 18A, 50 preferably contact the inner surface 17e.

A third embodiment of the present invention will now be described with reference to FIGS. 8 to 10B. The differences from the first embodiment will mainly be discussed below. Each of the FIGS. 8 to 10B schematically shows the structure of a semiconductor device 10C according to the third embodiment. For the illustrative purposes, the dimensions of some of the elements are exaggerated. That is, the ratios of the widths, lengths, and thicknesses of some of the elements of the semiconductor device 10C in the drawings are not to scale. The semiconductor device 10C is mounted on a vehicle.

Figure 8:
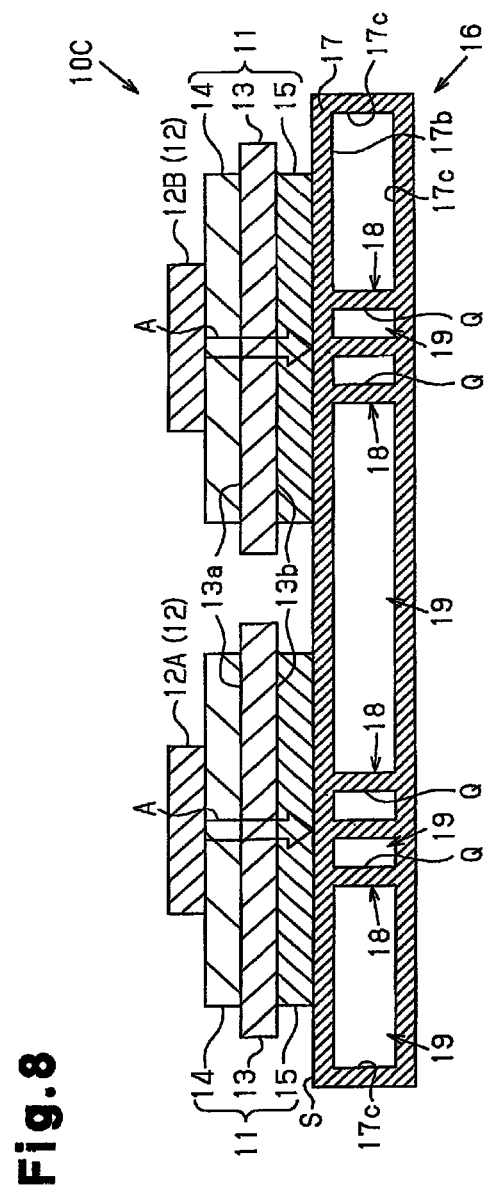
FIG. 8 is a schematic cross-sectional view illustrating a semiconductor device according to a third embodiment of the present invention.
Figure 9:
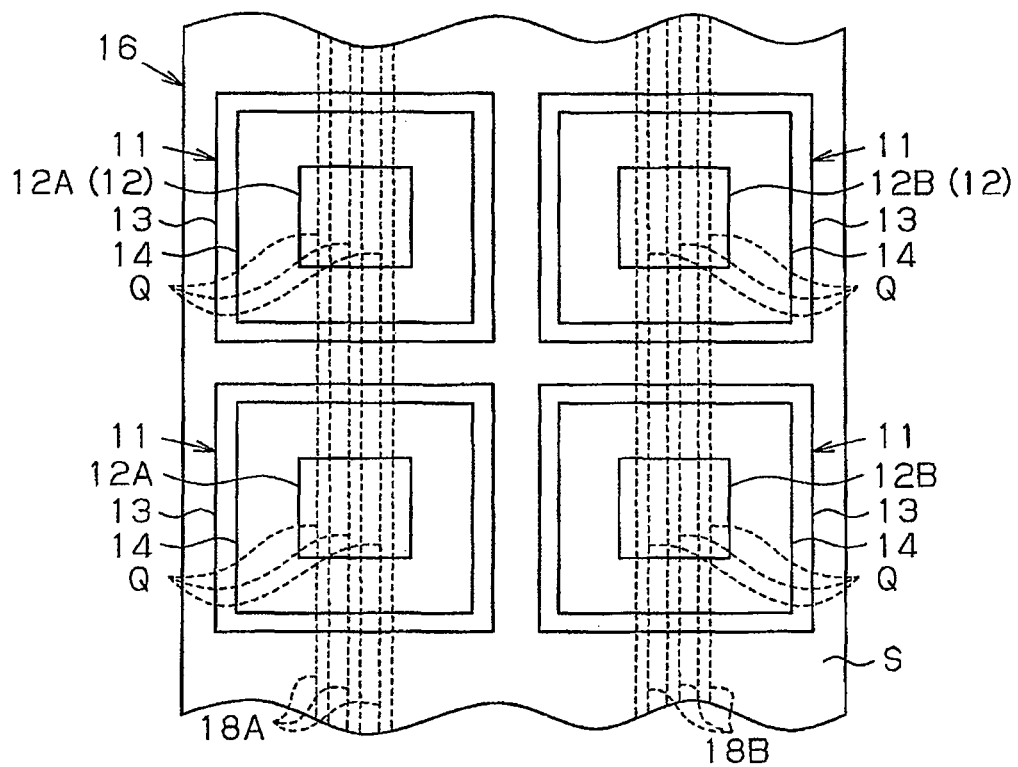
FIG. 9 is a schematic plan view of the semiconductor device shown in FIG. 8.

As shown in FIGS. 8 and 9, partitioning walls 18 of the present embodiment are formed to pass through regions directly below a plurality of semiconductor elements 12. The semiconductor elements 12 include semiconductor elements 12A that are located on the left side as viewed in FIG. 9 and linearly arranged in the vertical direction as viewed in FIG. 9. The partitioning walls 18 include three first partitioning walls 18A located in a region directly below the semiconductor elements 12 A. Likewise, semiconductor elements 12B are located on the right side as viewed in FIG. 9 and linearly arranged in the vertical direction as viewed in FIG. 9. The partitioning walls 18 include three second partitioning walls 18B located in a region directly below the semiconductor elements 12B. The first partitioning walls 18A and the second partitioning walls 18B are arranged at equal intervals. In the present embodiment, a region "directly below the semiconductor elements 12" refers to a region that overlaps the semiconductor elements 12 when viewed from above. Therefore, it does not include regions that are lower than the semiconductor element 12 but outside the edges of the semiconductor elements 12.

Portion of each partitioning wall 18 that are directly below the corresponding semiconductor elements 12 are referred to as corresponding portions Q. Each corresponding portion Q receives the heat generated in the corresponding semiconductor element 12 in a concentrated manner. All the regions that are directly below the semiconductor elements 12 have corresponding portions Q. Cooling medium passages 19, which are defined by the partitioning walls 18, connect an inlet and outlet (neither is shown) provided in the case portion 17. The inlet and outlet are formed to be connectable with a cooling medium circuit installed in the vehicle.

Operation of the semiconductor device 10C will now be described.

The semiconductor device 10C is mounted on a hybrid vehicle, and the heat sink 16 is connected to a cooling medium circuit (not shown) of the vehicle through pipes. The cooling medium circuit has a pump and a radiator. The radiator radiates the heat of the cooling medium. The cooling medium is, for example, water.

When the semiconductor element 12 mounted on the semiconductor device 10C is actuated, heat is generated from the semiconductor element 12. The heat generated in the semiconductor element 12 is conducted to the heat sink 16 through the first metal plate 14, the ceramic substrate 13, the second metal plate 15, and the heat sink 16 as shown by arrows A in FIG. 8. When the heat is conducted from the semiconductor elements 12 to the heat sink 16, the circuit substrates 11 and the heat sink 16 are heated to high temperature and thermally expanded. At this time, since the coefficient of linear expansion of the ceramic substrate 13 and the coefficient of linear expansion of the metal members (the heat sink 16 and the first and second metal plates 14, 15) are different, the amount of expansion of the ceramic substrate 13 is different from that of the heat sink 16 and the first and second metal plates 14, 15. This generates thermal stress in the semiconductor device 10C. Since the heat sink 16 has no partitioning walls other than the partitioning walls 18, which pass through the region directly below the semiconductor elements 12, the number of partitioning walls that restrict deformation of the case portion 17 is small. Accordingly, the ratio of the volume of the partitioning walls 18 is small in the case portion 17. Therefore, compared to a heat sink that has, in addition to the partitioning walls 18, partitioning walls that have the same structure as the partitioning walls 18 and are located in regions other than regions directly below the semiconductor elements 12, the heat sink 16 is more easily deformed so that the thermal stress generated in the semiconductor device 10C is effectively relaxed. As a result, when the temperature of the circuit substrates 11 and heat sink 16 increases, it is possible to inhibit the joint portions between the ceramic substrates 13 and the second metal plates 15 from cracking, and the joint surface of the heat sink 16 that faces the circuit substrates 11 from warping.

When the heat generated in the semiconductor elements 12 is transmitted to the heat sink 16, the heat is first transmitted in a concentrated manner to parts of the case portion 17 that are directly below the semiconductor elements 12 and the corresponding parts Q of the partitioning walls 18. The heat is thereafter transmitted to the entire heat sink 16. In each of the regions directly below the semiconductor elements 12, the partitioning walls 18 allow effective heat exchange to take place with the cooling medium, so that the heat transmitted to the case portion 17 and the partitioning walls 18 are smoothly removed. That is, since the heat sink 16 is forcibly cooled by the cooling medium flowing through the cooling medium passages 19, the temperature gradient of the conduction path of heat from the semiconductor element 12 to the heat sink 16 is increased. This allows the heat generated in the semiconductor element 12 to be efficiently removed through the circuit substrate 11.

When the semiconductor element 12 stops generating heat, the temperature of the circuit board 11 and the heat sink 16 is lowered, and the circuit board 11 and the heat sink 13 are thermally shrunk. At this time, being easily deformed, the heat sink 16 relaxes the thermal stress generated in the semiconductor device 10C. Therefore, when the temperature of the circuit substrates 11 and heat sink 16 lowers, it is possible to inhibit the joint portions between the ceramic substrates 13 and the second metal plates 15 from cracking, and the joint surface of the heat sink 16 that faces the circuit substrates 11 from warping.

The present embodiment has the following advantages.

(1) In the case portion 17, the partitioning walls 18 are each located to pass through a region directly below one of the semiconductor elements 12, and no partition wall is provided in regions other than regions directly below the semiconductor elements 12. Therefore, the number of partitioning walls that restrict deformation of the case portion 17 is reduced, so that the ratio of the volume of the partitioning walls 18 in the case portion 17 is reduced. This lowers the rigidity of the heat sink 16, so that the stress relaxation performance of the heat sink 16 is improved.

(2) The partitioning walls 18 exist in each region directly below the semiconductor elements 12. Therefore, heat is effectively radiated from the region directly below each semiconductor element 12.

(3) The partitioning walls 18 are arranged to pass through the regions directly below the linearly arranged semiconductor elements 12. Therefore, compared to a case where a single partitioning wall is provided to correspond to each semiconductor element 12 so as to pass through a region directly below the semiconductor element 12, the number of the partitioning walls 18 in the heat sink 16 is reduced. This simplifies the structure of the heat sink 16.

The third embodiment is not limited to the above described configuration, but may be embodied as follows, for example.

The number of the partitioning walls 18 in the case portion 17 may be changed. As long as all the partitioning walls 18 are each arranged to pass through one of the region directly below the first semiconductor elements 12A and the region directly below the second semiconductor elements 12B, the number of the partitioning walls 18 may be increased or decreased. However, when increasing the number of the partitioning walls 18, the number of the partitioning walls 18 needs to set within a range that allows the heat sink 16 to sufficiently exert its stress relaxation performance.

The partitioning walls 18 may be integrated. For example, the three partitioning walls 18 on the left side in FIG. 8 may be formed by corrugated fins located in a region directly below the first semiconductor elements 12A. Likewise, the three partitioning walls 18 on the right side in FIG. 8 may be formed by corrugated partitioning plates located in a region directly below the first semiconductor elements 12B.

The shape of the partitioning walls 18 is not limited to that according to the third embodiment. Instead of linearly extending partitioning walls, zigzag partitioning walls 60 shown in FIG. 10A may be provided. This structure disturbs the flow of cooling medium flowing between the partitioning walls 60. Thus, compared to the case of linearly extending partitioning walls, the cooling performance is improved.

In place of the continuously extending partitioning walls 18, discontinuous partitioning walls 18 having wall segments may be provided. For example, each discontinuous partitioning wall 18 has a gap of a predetermined length in a region outside the region directly below the semiconductor element 12 and has wall segments that continues after the gap.

Figure 10A:
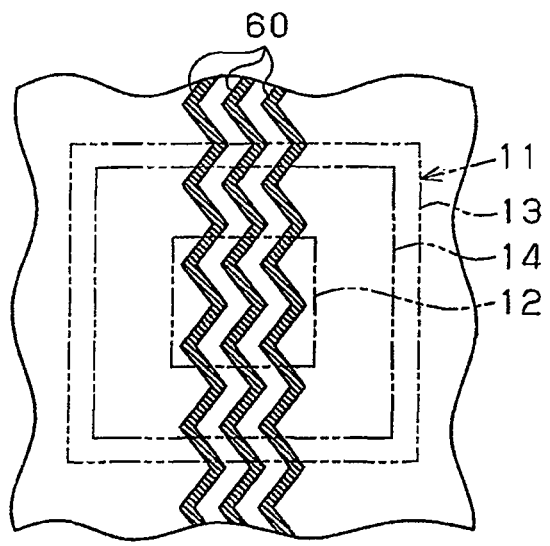
FIG. 10A is a schematic partial cross-sectional view illustrating partitioning walls of a semiconductor device according to a modification of the third embodiment.
Figure 10B:
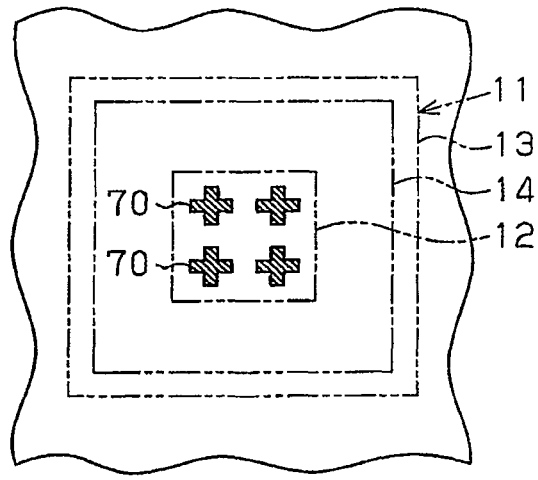
FIG. 10B is a schematic partial cross-sectional view illustrating partitioning walls of a semiconductor device according to a modification of the third embodiment.

It may be configured such that a single partitioning wall 18 passes through a region directly below a single semiconductor element 12. For example, a plurality of semiconductor elements 12 may be arranged in a line, and partitioning walls 18 extending in one direction may be provided such that each partitioning wall 18 corresponds to one of the semiconductor elements 12. In this case, each partitioning wall 18 separately passes through a region directly below one of the semiconductor elements 12. Alternatively, as shown in FIG. 10B, a plurality of fins 70 (partitioning walls), which are cross-shaped in a planar view, may be provided to correspond to each semiconductor element 12, such that fins located in a region directly below each semiconductor element 12 are independent from each other. Compared to a case where partitioning walls 18 that continuously extend in one direction, cooling medium is more greatly disturbed, so that the cooling performance is improved. Also, the cooling performance is not easily influenced by the flow of cooing medium.

The number of the semiconductor elements 12 on the circuit substrate 11 is not particularly limited. Two or more semiconductor elements 12 may be mounted on a single circuit substrate 11.

A stress relaxation member as described in the first embodiment may be located between each second metal plate 15 and the heat sink 16.

The above described embodiments may be modified as follows.

The material for forming the heat sink 16 may be any metal that has a coefficient of linear expansion different from that of the ceramic substrate 13. For example, the heat sink 16 may be made of aluminum or copper. Aluminum refers to pure aluminum and aluminum alloys.

The material for forming the ceramic substrate 13 is not particularly limited. The ceramic substrate 13 may be formed, 30 for example, of aluminum nitride, alumina, or silicon nitride.

In the illustrated embodiments, water flows through the heat sink 16. However, liquid other than water, such as alcohol, may flow through the heat sink 16. The cooling medium that flows through the heat sink 16 is not limited to liquid, but may be gas such as air.

The semiconductor devices 10A, 10B, 10C do not need to be installed on vehicles but may be applied to other uses.

What is claimed:

1. A semiconductor device comprising:
an insulation substrate having a first surface and a second surface that is opposite to the first surface;
a first metal plate joined to the first surface of the insulation substrate;
a semiconductor element joined to the first metal plate;
a second metal plate joined to the second surface of the insulation substrate; and
a heat sink for cooling the semiconductor element, the heat sink being coupled to the second metal plate such that heat can be conducted,
wherein the heat sink includes a case portion and a plurality of partitioning walls located in the case portion, the partitioning walls defining a plurality of cooling medium passages,
wherein the case portion has a surface that faces the second metal plate, which the surface includes a joint region, to which the second metal plate is joined, and a non-joint region, to which the second metal plate is not joined,
wherein each partitioning wall includes a first end facing the second metal plate and a second end opposite to the first end, wherein the partitioning walls include first partitioning walls and second partitioning walls, adjacent pairs of the first and second partitioning walls, and the outermost second partitioning walls and side walls of the case portion defining the cooling medium passages, the first end of each first partitioning wall being joined to an inner surface of the case portion, the second end of each first partitioning wall not being joined to an inner surface of the case portion, and the first and second ends of each second partitioning wall being joined to the inner surfaces of the case portion,
wherein, among the first and second partitioning walls, at least one or more of the first partitioning walls pass through a region in the case portion that corresponds to the joint region, and
wherein, among the first and second partitioning walls, only one or more of the second partitioning walls pass through only a region in the case portion that corresponds to the non-joint region.

2. The semiconductor device according to claim 1, wherein all the partitioning walls that pass through the region in the case portion that corresponds to the joint region are the first partitioning walls.

3. The semiconductor device according to claim 1, wherein the second end of each first partitioning wall contacts the inner surface of the case portion.

4. The semiconductor device according to claim 1, wherein a stress relaxation member made of a material having a high thermal conductivity is located between the second metal plate and the heat sink.

* * * * *